United States Patent

Hoshi

[15] 3,696,301

[45] Oct. 3, 1972

[54] TUNING INDICATING APPARATUS FOR FM RECEIVER

[72] Inventor: Juro Hoshi, Hamamatsu, Japan

[73] Assignee: Nippon Gakki Seizo Kabushiki Kaisha, Hamamatsu-shi, Japan

[22] Filed: Oct. 5, 1970

[21] Appl. No.: 77,890

[30] Foreign Application Priority Data

Oct. 8, 1969 Japan ......................44/95493

[52] U.S. Cl. ...................325/398, 325/318, 325/455

[51] Int. Cl. ..............................................H04b 1/16

[58] Field of Search .........324/78 E, 78 F, 78 J, 78 Z, 324/81; 325/319, 344, 349, 398, 455

[56] References Cited

UNITED STATES PATENTS 2,836,712 5/1958 Crosby..................325/455 X
3,333,201 7/1967 Hopengarten.............325/455
3,365,669 1/1968 Fanaki et al...............325/455

*Primary Examiner*—Benedict V. Safourek
*Attorney*—Curt M. Avery, Arthur E. Wilfond, Herbert L. Lerner and Daniel J. Tick

[57] ABSTRACT

In an FM receiver, a tuning indicating apparatus comprises a differential amplifier for receiving an FM detector output and delivering an output under a frequency-to-output response curve of a W-shape which is obtained by inverting one half of an S-shaped response curve of the FM detector; an AM detector connected to an IF amplifier; an AND circuit responsive to the outputs from the differential amplifier and the AM detector; and a tuning indicator energized by an output from the AND circuit.

3 Claims, 3 Drawing Figures

INVENTOR.
Juro Hoshi

INVENTOR.

TUNING INDICATING APPARATUS FOR FM RECEIVER

BACKGROUND OF THE INVENTION

This invention relates to a tuning indicating apparatus utilized in an FM receiver for indicating the balanced point (zero potential point) of an S-shaped response curve of the FM detector, and more particularly to a tuning indicating apparatus wherein the deflection of an indicating meter or the light quantity of a tuning lamp becomes maximum at the correct tuning. In the FM radio receiver, if the tuning were not accurate there will be caused, due to loss of higher portions of one side band, such troubles as a decrease in the fidelity, an increase in the distortion and noise, and deterioration of the stereo separation. For this reason, to correctly receive FM broadcasting, it is important to provide the correct tuning.

However, in FM receivers, since the sound volume of the loudspeaker does not change appreciably, it is difficult to discriminate the correct tuning point by hearing.

Among prior art tuning indicating systems are included:

1. A system wherein a carrier wave of 10.7MHz is detected from an IF (intermediate frequency) amplifier stage.
2. A system wherein a separate IF amplifier circuit particularly designed for tuning is used to operate an indicating meter.
3. A system wherein an output from an FM detector having an S-shaped detecting characteristic is indicated directly by a meter.
4. A system wherein a Schmitt trigger circuit is employed to indicate the output of a frequency discriminator (FM detector) by an electric lamp.

However, with systems other than No. 3 above, it is difficult to obtain accurate tuning. More particularly, with systems other than No. 3, when the antenna input varies from a minimum to a maximum, it is impossible to provide complete tuning so that the point at which the distortion is the minimum does not coincide with the point at which the deflection of the tuning meter is the maximum. For this reason, systems other than No. 3 are utilized as signal meters for representing the magnitude of the signals, and not as tuning meters. In these systems, an additional zero center type meter is used as the tuning meter, thus requiring two meters.

Further in the systems other than No. 3, as it is necessary to coincide the meter deflection with the tuning point it requires much time for adjustment. Further, in the system 3 wherein the S-shaped characteristic of the FM detector is indicated directly by an indicating meter, although it is possible to provide correct tuning, as it is necessary to read the zero point of the meter, a substantial skill is required. Thus, it is difficult to read the perfect tuning point.

SUMMARY OF THE INVENTION

It is therefore an object of this invention to provide a novel FM tuning indicating apparatus which can eliminate various problems described above.

A more specific object of this invention is to provide a novel FM tuning indicating apparatus wherein the balance point or zero point of the letter S which is shaped in the response curve of the FM detector is detected thus readily indicating correct tuning point.

According to this invention, there is provided a tuning indicating apparatus for an FM receiver which includes an RF tuner, an IF amplifier and an FM detector connected in cascade; said apparatus comprising a differential amplifier which receives an FM detector output and delivers with the assistance of the hereinafter described AND circuit, a first output under a frequency-to-output response curve of a W-shape which is obtained by inverting one half of an S-shaped response curve of the FM detector, an AM detector which receives an IF amplifier output and delivers a second output under a frequency-to-output response curve of an inverted U-shape, an AND circuit which receives the first and the second output and delivers a third output which is equal to the lower of the two outputs, and a tuning indicator which receives the third output and visually indicates the magnitude of the third output.

BRIEF DESCRIPTION OF THE DRAWINGS

The organization and operation of the invention will become apparent from the following detailed description when taken in connection with the accompanying drawings, in which.

DESCRIPTION OF THE PREFERRED EMBODIMENT

Figure 1:
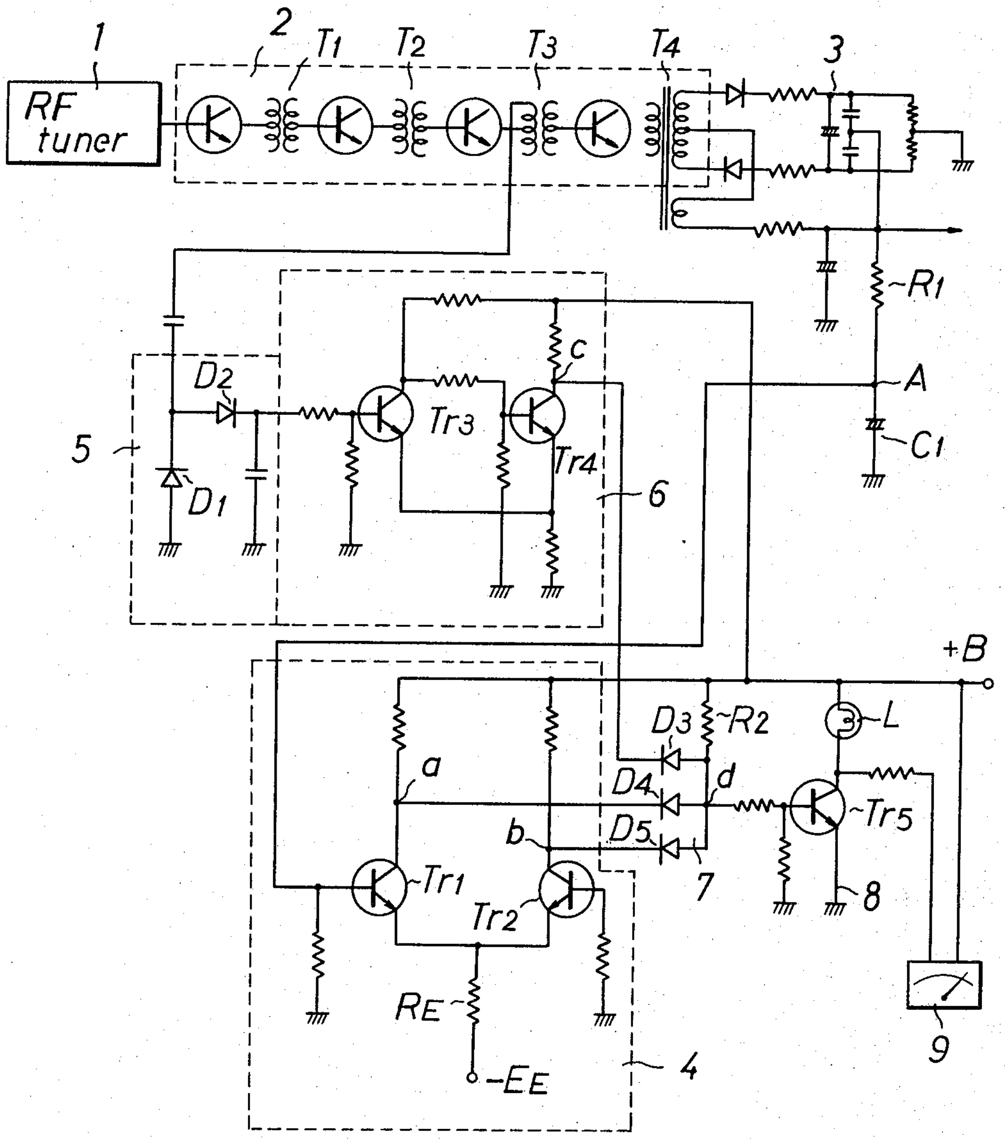
FIG. 1 is a circuit diagram of one example of a tuning indicating apparatus embodying this invention utilized in an FM receiver.
Figure 2:
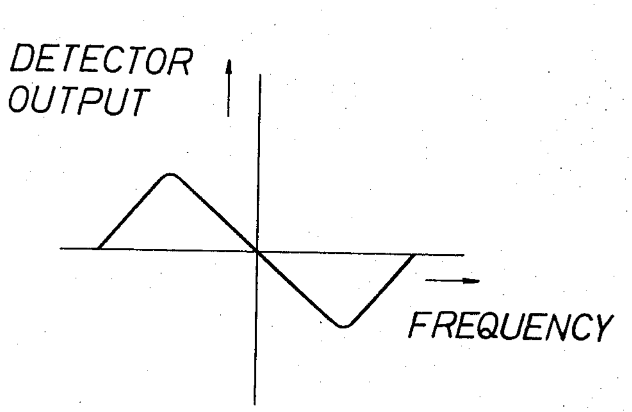
FIG. 2 is a chart to show the frequency-to-output response curve of an FM detector.

Referring now to FIG. 1 of the accompanying drawing, an FM receiver comprises an RF tuner 1 including an RF amplifier, a frequency converter and a local oscillator (all not shown), an IF (10.7MHz) amplifier for amplifying an IF signal produced by the frequency converter and including cascade connected four stages and an IF transformer $T_4$, and an FM detector having an S-shaped frequency-to-output response curve and connected to a secondary winding of the IF transformer. A tuning indicating apparatus comprises a differential amplifier 4, an AM detector 5 with an amplifier 6, an AND circuit 7, and a tuning indicator including a drive amplifier 8 and a tuning meter 9. The differential amplifier 4, together with the AND circuit, is provided to detect the balanced point (or zero point) of the letter S-shaped response curve of the FM detector 3 by converting the S-shaped response curve into a W-Shaped response curve which is obtained by inverting one half of the S-shaped curve. The amplifier 4 comprises a pair of symmetrically connected transistors Tr1 and Tr2 and the emitter electrodes of these transistors are supplied with a predetermined current through a common resistor RE from a source of power —EE and the base electrodes are both supplied with a ground potential bias through respective resistors. The base electrode of transistor Tr1 is connected to the juncture A between a resistor R1 and a capacitor C1 which are connected in series across the output terminals of the FM detector 3, thus controlling the bias voltage for transistor Tr1 in accordance with the DC output voltage appearing at juncture A. No external signal is supplied to the base electrode of the transistor Tr2. Outputs of S-shaped characteristics of opposite shapes to each other are provided at the collector electrodes.

Figure 3:
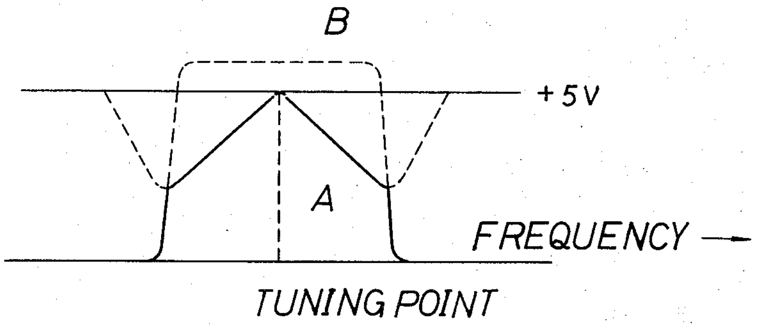
FIG. 3 is a chart to show the frequency-to-output response curve of the FM tuning indicating apparatus constructed according to the teaching of the invention.

Curve A in FIG. 3 shows the letter W-shaped frequency-to-output characteristic of the differential amplifier 4 and the AND circuit which shows that one half of the letter S-shaped characteristic from the FM detector has been inverted. The AM detector 5 comprises a pair of diodes D1 and D2 connected to the third stage of the IF amplifier 2 to detect the received signal or a carrier wave of 10.7 MHz, and the output of the AM detector 5 is amplified by the amplifier 6 including two transistors Tr3 and Tr4 and is then applied to the AND circuit 7 to be described later. Curve B in FIG. 3 represents the frequency-to-output characteristic as viewed at the output of the amplifier 6. AND circuit 7 comprises three diodes D3, D4 and D5, the anode electrodes of these diodes being connected to a source of positive bias voltage +B via a resistor R2. The cathode of diode D3 is connected to the collector electrode of transistor Tr4 while the cathodes of diodes D4 and D5 are connected to the collector electrodes of transistors Tr1 and Tr2, respectively, of the differential amplifier 4. The anodes of diodes D3, D4 and D5 are also connected in common to the base electrode of the transistor Tr5 of the drive amplifier 8, the collector electrode of transistor Tr5 being connected to an indicating lamp L or a tuning meter 9 for indicating the tuning point.

When the FM receiver is not tuned, there is no output from the IF transformer Tr3 so that transistor Tr4 of the amplifier 6 connected to transformer T3 via the AM detector 5 remains conductive to render the diode D3 conductive. At the same time, a positive or a negative voltage appears at point A of the series circuit connected to the output terminal of the FM detector 3. This voltage is applied to the base electrode of transistor Tr1 of differential amplifier 4 to cause it to operate. As a consequence, currents flowing through transistors Tr1 and Tr2 become unbalanced so as to decrease the collector voltage at either point *a* or point *b* thus rendering either one of diodes D4 and D5 of AND circuit 7 conductive. Consequently, the potential at point *d* is determined by the output voltage of either the amplifier 6 or the differential amplifier 4 having lower output voltage. This decrease in the potential of point *d* in the AND circuit 7 interrupts the current flowing through transistor Tr5 of the drive amplifier 8 to deenergize the lamp L and the meter 9.

When the FM receiver is tuned perfectly the carrier wave signal is applied to the base electrode of transistor Tr3 of the amplifier 6 from the IF transformer T3 through the AM detector 5 to render the transistor Tr3 conductive. At the same time, transistor Tr4 is turned OFF whereby the collector potential thereof is increased to render the diode D3 of the AND circuit 7 nonconductive. On the other hand, the potential at juncture A becomes zero whereby the currents of transistors Tr1 and Tr2 of the differential amplifier 4 become balanced to bring the potentials of points *a* and *b* to the same positive value thus maintaining the diodes D4 and D5 of the AND circuit 7 nonconductive. It is to be understood that the circuits are constructed such that the potential of point *c* of the amplifier 6 is higher than the potentials of points *a* and *b* of the differential amplifier under these conditions. Consequently, the potential of point *d* is increased to apply to the base electrode of transistor Tr5 of the drive amplifier 8 the peak value or the crest value of the middle leg of W indicated by the solid line curve A shown in FIG. 3 whereby the transistor Tr5 becomes conductive to supply the maximum current to the lamp L and the meter 9 to indicate the correctly tuned state.

As above described, according to the tuning indicating device of this invention, the balanced point of the letter S characteristic of the FM detector response curve is detected by the differential amplifier and the AND circuit as a sharp peak of a W-shaped, and the output signal of the differential amplifier and a signal taken from an intermediate stage of the IF amplifier to indicate that the receiver is just receiving an input signal are supplied to the AND circuit. The output signal from the AND circuit is utilized to control the indicating meter or lamp. Thus, the deflection of the pointer of the meter or the light quantity of the lamp becomes maximum at the time of correct tuning. Further, as the rate of variation of the output signal is steep near the exact tuning point, it is possible to readily and accurately determine the tuning point. In addition, only one tuning point indicator is sufficient thereby simplifying the tuning indicating apparatus. The output which reaches the maximum value at the middle of a letter W-shaped characteristic which is obtained by inverting one half of a letter S-shaped characteristic can be used for automatic tuning control.

While the invention has been shown and described in terms of a preferred embodiment thereof, it will be clear that many changes and modifications will occur to one skilled in the art without departing from the true spirit and scope of the invention as defined in the appended claims.

What is claimed is:

1. In an FM receiver including an RF tuner, an IF amplifier and an FM detector having an output and exhibiting an S-shaped frequency to voltage characteristic curve, tuning apparatus comprising a differential amplifier having an input connected to an output of the FM detector and another input free from an external signal, the differential amplifier having two outputs;

an AM detector connected to the IF amplifier for detecting the receiving of a radio signal by the receiver, the AM detector having an output;

an AND circuit having an input connected to an output of the differential amplifier, another input connected to another output of the differential amplifier, and still another input connected to an output of the AM detector, the differential amplifier and the AND circuit together producing a W-shaped frequency to voltage characteristic curve by inverting one half of the S-shaped characteristic curve of the FM detector thereby determining the zero point of the S-shaped curve as a peak point; and tuning indicating means energized by an output from the AND circuit and exhibiting a maximum indication when the receiver is tuned.

2. Tuning apparatus as claimed in claim 1, further comprising an amplifier connected between the AND circuit and the tuning indicating means.

3. Tuning apparatus as claimed in claim 1, wherein the differential amplifier comprises a pair of transistor amplifiers each having emitter, collector and base electrodes, a negative power source, a common resistor, a pair of base resistors, the emitter electrodes of the transistor amplifiers being connected to the negative power source via the common resistor, the base electrode of each of the transistors being connected to a point at ground potential via a corresponding one of the base resistors, the collector electrode of each of the transistors being connected to a corresponding one of the inputs of the AND circuit.

* * * * *